(12) United States Patent
Davies et al.

(10) Patent No.: US 11,954,820 B2
(45) Date of Patent: Apr. 9, 2024

(54) GRAPH ALIGNMENT TECHNIQUES FOR DIMENSIONING DRAWINGS AUTOMATICALLY

(71) Applicant: AUTODESK, INC., San Francisco, CA (US)

(72) Inventors: Thomas Ryan Davies, Toronto (CA); Alexander Ray Carlson, Portland, OR (US); Aditya Sanghi, Toronto (CA); Tarkeshwar Kumar Shah, Pune (IN); Divya Sivasankaran, Toronto (CA); Anup Bhalchandra Walvekar, Pune (IN); Ran Zhang, San Jose, CA (US)

(73) Assignee: AUTODESK, INC., San Francisco, CA (US)

( * ) Notice: Subject to any disclaimer, the term of this patent is extended or adjusted under 35 U.S.C. 154(b) by 184 days.

(21) Appl. No.: 17/374,722

(22) Filed: Jul. 13, 2021

(65) Prior Publication Data
US 2022/0318947 A1    Oct. 6, 2022

Related U.S. Application Data

(60) Provisional application No. 63/169,612, filed on Apr. 1, 2021.

(51) Int. Cl.
*G06T 3/40*    (2006.01)
(52) U.S. Cl.
CPC ...... *G06T 3/40* (2013.01); *G06T 2207/20081* (2013.01)

(58) Field of Classification Search
None
See application file for complete search history.

(56) References Cited

U.S. PATENT DOCUMENTS

| 9,836,183 | B1* | 12/2017 | Love | G06F 16/904 |
|---|---|---|---|---|
| 2018/0024981 | A1* | 1/2018 | Xia | G06F 40/18 |
| | | | | 715/215 |
| 2020/0210858 | A1* | 7/2020 | De Bie | G06N 7/01 |
| 2021/0397942 | A1* | 12/2021 | Collomosse | G06F 16/583 |

OTHER PUBLICATIONS

Sanchez-Gonzales et al., "Learning to Simulate Complex Physics with Graph Networks", arXiv:2002.09405v2 [cs.LG] Sep. 14, 2020, https://arxiv.org/abs/2002.09405, 20 pages.

(Continued)

*Primary Examiner* — Yanna Wu
(74) *Attorney, Agent, or Firm* — Artegis Law Group, LLP

(57) ABSTRACT

One embodiment of the present invention sets forth a technique for adding dimensions to a target drawing. The technique includes generating a first set of node embeddings for a first set of nodes included in a target graph that represents the target drawing. The technique also includes receiving a second set of node embeddings for a second set of nodes included in a source graph that represents a source drawing, where one or more nodes included in the second set of nodes are associated with one or more source dimensions included in the source drawing. The technique further includes generating a set of mappings between the first and second sets of nodes based similarities between the first set of node embeddings and the second set of node embeddings, and automatically placing the one or more source dimensions within the target drawing based on the set of mappings.

20 Claims, 7 Drawing Sheets

(56) References Cited

OTHER PUBLICATIONS

Hu et al., Strategies for Pre-Training Graph Neural Networks, arXiv: 1905.12265v3 [cs.LG] Feb. 18, 2020, https://arxiv.org/pdf/1905.12265.pdf, 22 pages.

Velickovic et al., "Deep Graph Infomax", arXiv:1809.10341v2 [stat.ML] Dec. 21, 2018, https://arxiv.org/pdf/1809.10341.pdf, 17 pages.

Battaglia et al., "Relational inductive biases, deep learning, and graph networks", arXiv:1806.01261v3 [cs.LG] Oct. 17, 2018, https://arxiv.org/pdf/1806.01261.pdf, 40 pages.

Ying et al., "Hierarchical Graph Representation Learning with Differentiable Pooling", 32nd Conference on Neural Information Processing Systems (NeurIPS 2018), Montreal, Canada, https://papers.nips.cc/paper/2018/file/e77dbaf6759253c7c6d0efc5690369c7-Paper.pdf, 11 pages.

Dassault Systems, "Autodimension a Drawing", http://help.solidworks.com/2018/english/solidworks/sldworks/c_Autodimension_a_Drawing.htm, 2 pages.

Extended European Search Report for Application No. 22162113.9 dated Jan. 10, 2023.

Tfordesign, "Solidworks Drawing Tutorial: Model Items (Parts)", Retrieved from the Internet: URL:https://www.youtube.com/watch?v=JAPbdKI4VtQ, Aug. 19, 2018, 2 pages.

Li et al., "Automated Dimensioning Method of Engineering Drawings for Mechanical Products Based on Curve Chain", Computers, Materials & Continua, DOI:10.32604/cmc.2020.011398, vol. 65, No. 1, Jul. 2020, pp. 847-863.

Chen et al., "Intelligent dimensioning for mechanical parts based on feature extraction", Computer-Aided Design, vol. 33, No. 13, Nov. 2001, pp. 949-965.

Nie et al., "Multi-graph Convolutional Network for Unsupervised 3D Shape Retrieval", Proceedings of the 28th ACM International Conference on Multimedia, DOI:10.1145/3394171.3413987, Oct. 12-16, 2020, pp. 3395-3403.

Patil et al., "LayoutGMN: Neural Graph Matching for Structural Layout Similarity", Dec. 11, 2020, pp. 1-10.

\* cited by examiner

GRAPH ALIGNMENT TECHNIQUES FOR DIMENSIONING DRAWINGS AUTOMATICALLY

CROSS-REFERENCE TO RELATED APPLICATIONS

This application claims benefit of the U.S. Provisional Patent Application titled "GRAPH ALIGNMENT FOR AUTOMATED DIMENSIONING OF DRAWINGS," filed Apr. 1, 2021 and having Ser. No. 63/169,612. The subject matter of this related application is hereby incorporated herein by reference.

FIELD OF THE VARIOUS EMBODIMENTS

Embodiments of the present disclosure relate generally to computer science and machine learning and, more specifically, to graph alignment techniques for dimensioning drawings automatically.

DESCRIPTION OF THE RELATED ART

Design documentation for a three-dimensional (3D) component commonly includes one or more two-dimensional (2D) drawings of the 3D component. Each 2D drawing includes different views of the 3D component placed within a drawing sheet as well as the dimensions required to manufacture or assemble the 3D component. For example, a 2D drawing could include top, front, side, isometric, section, detail, cutout, auxiliary, exploded, or other views of the 3D component. Each view could include dimensions for various lines, arcs, circles, ellipses, or other entities within the view.

Computer-aided design (CAD) programs include tools that expedite the creation of 2D drawings from models of 3D components. For example, a user could use a CAD program to create a model of a 3D component in the first instance, or a user could load a preexisting model of a 3D component into a CAD program. The user could then use a "smart template" provided by the CAD program to automatically generate multiple drawing sheets for the model that have predefined paper sizes, predefined formats, and predefined views. The smart template also can be used to generate a part lists from the model.

Despite the many ways CAD programs facilitate the creation of 2D drawings from models of 3D components, adding dimensions to a 2D drawing within a CAD program is still a time-consuming and tedious process. For example, a user could use a dimensioning tool provided by a CAD program to manually select dimensions from a model of a 3D component for insertion into a 2D drawing corresponding to the model. The user also could use the dimensioning tool to manually edit, format, place, orient, or otherwise adjust the appearance of each dimension within the 2D drawing. With this type of approach, the user has to continue adding dimensions to and adjusting existing dimensions within the 2D drawing via the dimensioning tool until all manufacturing, assembly, design, industry, company, vendor, documentation, readability, personal, and/or other requirements for the 2D drawing are met.

In an effort to reduce the time and effort associated dimensioning 2D drawings, some CAD programs provide "auto-dimensioning" tools that implement sets of rules for automatically extracting dimensions from a given model of a 3D component and adding the extracted dimensions to a 2D drawing created from the model. One drawback of auto-dimensioning tools is that these tools usually add all of the dimensions included in a model of a 3D component to a given 2D drawing instead of adding only the dimensions from the model that are necessary to manufacture the 3D component. This type of "over-dimensioning" within the 2D drawing can cause extension lines and text for the different dimensions to overlap within the 2D drawing, which negatively impacts the readability of the drawing and the usefulness of the dimensions within the 2D drawing.

As the foregoing illustrates, what is needed in the art are more effective techniques for adding dimensions to computer-generated 2D drawings of 3D components.

SUMMARY

One embodiment of the present invention sets forth a technique for adding dimensions to a target drawing. The technique includes generating a first set of node embeddings for a first set of nodes included in a target graph that represents the target drawing. The technique also includes receiving a second set of node embeddings for a second set of nodes included in a source graph that represents a source drawing, where one or more nodes included in the second set of nodes are associated with one or more source dimensions included in the source drawing. The technique further includes generating a set of mappings between the first set of nodes and the second set of nodes based on one or more similarities between the first set of node embeddings and the second set of node embeddings, and automatically placing at least one dimension included in the one or more source dimensions within the target drawing based on the set of mappings.

One technical advantage of the disclosed techniques relative to the prior art is that, with the disclosed techniques, the amount of time and user effort required to dimension drawings within a CAD program can be substantially reduced. In that regard, the disclosed techniques can be used to perform dimensioning of drawings within a CAD program in a more computationally efficient manner relative to prior art approaches of dimensioning drawings using CAD software. Another technical advantage is that, with the disclosed techniques, user-specified or standardized attributes of dimensions from one or more source drawings can be transferred to a target drawing. Accordingly, dimensions placed into a target drawing automatically via the disclosed techniques are able to conform to various design documentation requirements more readily relative to dimensions placed automatically via conventional rules-based auto-dimensioning tools. These technical advantages provide one or more technological improvements over prior art approaches.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

DETAILED DESCRIPTION

In the following description, numerous specific details are set forth to provide a more thorough understanding of the various embodiments. However, it will be apparent to one of skill in the art that the inventive concepts may be practiced without one or more of these specific details.

System Overview

Figure 1:
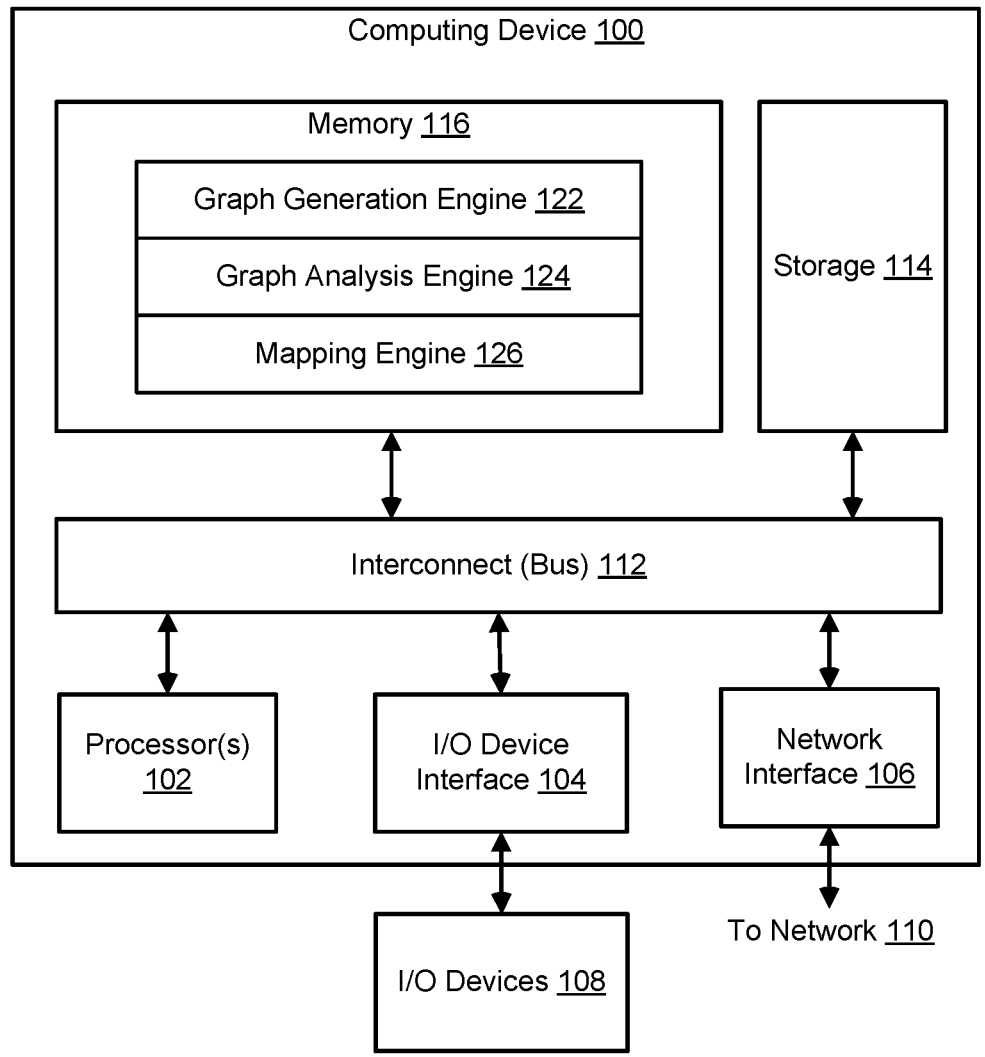
FIG. 1 illustrates a computing device configured to implement one or more aspects of various embodiments.

FIG. 1 illustrates a computing device 100 configured to implement one or more aspects of the present invention. Computing device 100 may be a desktop computer, a laptop computer, a smart phone, a personal digital assistant (PDA), tablet computer, or any other type of computing device configured to receive input, process data, and optionally display images, and is suitable for practicing one or more embodiments of the present invention. Computing device 100 is configured to run a graph generation engine 122, a graph analysis engine 124, and a mapping engine 126 that reside in a memory 116. It is noted that the computing device described herein is illustrative and that any other technically feasible configurations fall within the scope of the present invention. For example, multiple instances of graph generation engine 122, graph analysis engine 124, and mapping engine 126 could execute on a set of nodes in a distributed and/or cloud computing system to implement the functionality of computing device 100.

In one embodiment, computing device 100 includes, without limitation, an interconnect (bus) 112 that connects one or more processors 102, an input/output (I/O) device interface 104 coupled to one or more input/output (I/O) devices 108, memory 116, a storage 114, and a network interface 106. Processor(s) 102 may be any suitable processor implemented as a central processing unit (CPU), a graphics processing unit (GPU), an application-specific integrated circuit (ASIC), a field programmable gate array (FPGA), an artificial intelligence (AI) accelerator, any other type of processing unit, or a combination of different processing units, such as a CPU configured to operate in conjunction with a GPU. In general, processor(s) 102 may be any technically feasible hardware unit capable of processing data and/or executing software applications. Further, in the context of this disclosure, the computing elements shown in computing device 100 may correspond to a physical computing system (e.g., a system in a data center) or may be a virtual computing instance executing within a computing cloud.

In one embodiment, I/O devices 108 include devices capable of receiving input, such as a keyboard, a mouse, a touchpad, and/or a microphone, as well as devices capable of providing output, such as a display device and/or speaker. Additionally, I/O devices 108 may include devices capable of both receiving input and providing output, such as a touchscreen, a universal serial bus (USB) port, and so forth. I/O devices 108 may be configured to receive various types of input from an end-user (e.g., a designer) of computing device 100, and to also provide various types of output to the end-user of computing device 100, such as displayed digital images or digital videos or text. In some embodiments, one or more of I/O devices 108 are configured to couple computing device 100 to a network 110.

In one embodiment, network 110 is any technically feasible type of communications network that allows data to be exchanged between computing device 100 and external entities or devices, such as a web server or another networked computing device. For example, network 110 could include a wide area network (WAN), a local area network (LAN), a wireless (WiFi) network, and/or the Internet, among others.

In one embodiment, storage 114 includes non-volatile storage for applications and data, and may include fixed or removable disk drives, flash memory devices, and CD-ROM, DVD-ROM, Blu-Ray, HD-DVD, or other magnetic, optical, or solid-state storage devices. Graph generation engine 122, graph analysis engine 124, and mapping engine 126 may be stored in storage 114 and loaded into memory 116 when executed.

In one embodiment, memory 116 includes a random access memory (RAM) module, a flash memory unit, or any other type of memory unit or combination thereof. Processor(s) 102, I/O device interface 104, and network interface 106 are configured to read data from and write data to memory 116. Memory 116 includes various software programs that can be executed by processor(s) 102 and application data associated with said software programs, including graph generation engine 122, graph analysis engine 124, and mapping engine 126.

Graph generation engine 122, graph analysis engine 124, and mapping engine 126 include functionality to perform automatic dimensioning of drawings. More specifically, graph generation engine 122, graph analysis engine 124, and mapping engine 126 may automatically add dimensions to a two-dimensional (2D) drawing instead of requiring a user to manually specify and format the dimensions within the 2D drawing. As described in further detail below, this automatic dimensioning includes converting the 2D drawing into a graph; generating embedded representations of entities, views, and/or other components of the 2D drawing; and using the embedded representations to identify one or more "similar" 2D drawings and add dimensions from the similar 2D drawing(s) into the 2D drawing.

Graph Alignment for Dimensioning Drawings Automatically

Figure 2:
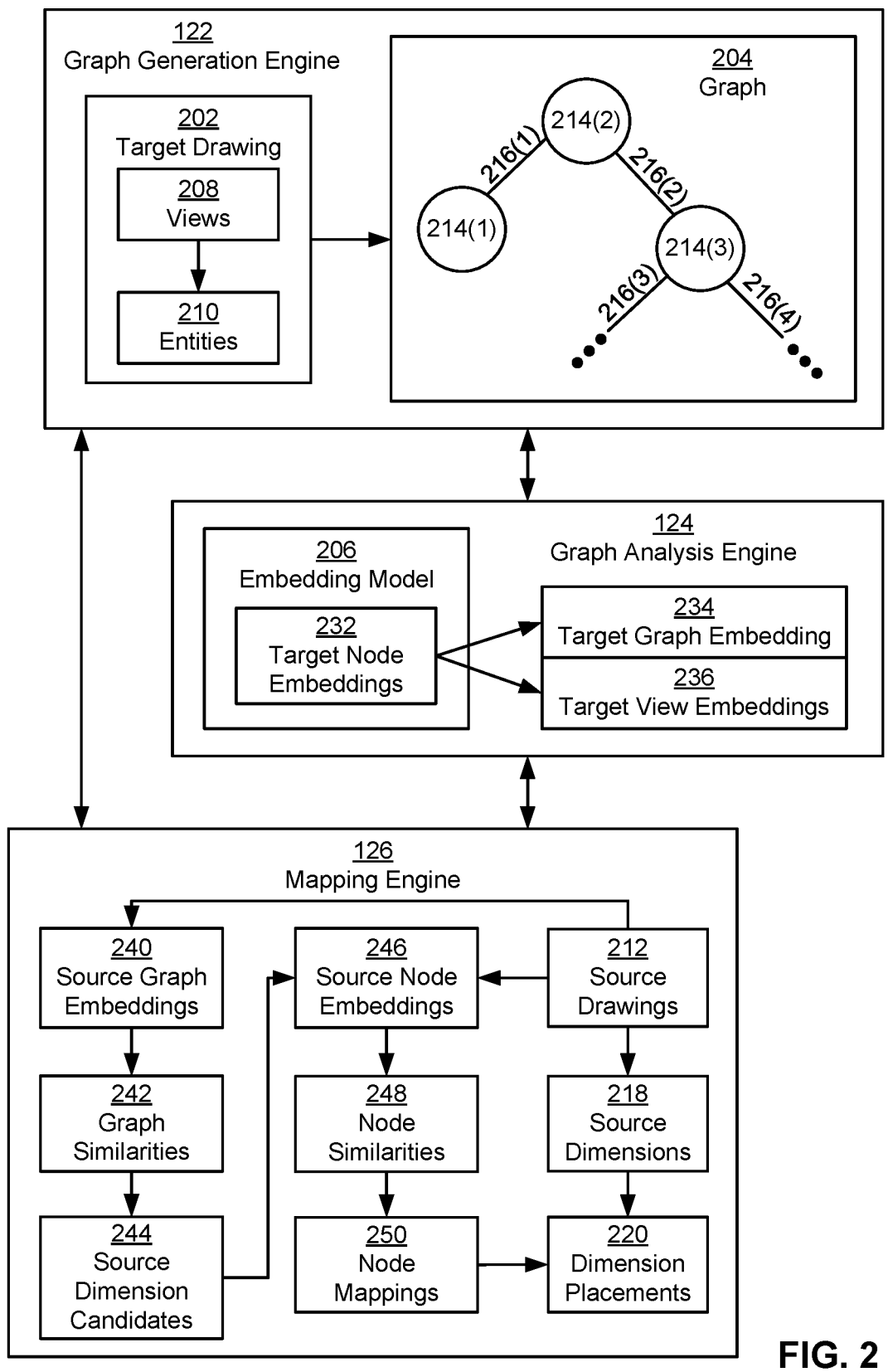
FIG. 2 includes more detailed illustrations of the graph generation engine, graph analysis engine, and mapping engine of FIG. 1, according to various embodiments.

FIG. 2 includes more detailed illustrations of graph generation engine 122, graph analysis engine 124, and mapping engine 126 of FIG. 1, according to various embodiments. As mentioned above, graph generation engine 122, graph analysis engine 124, and mapping engine 126 operate to automatically perform dimension placements 220 of one or more dimensions within a target drawing 202 based on source dimensions 218 included in one or more source drawings 212.

As shown in FIG. 2, target drawing 202 includes a number of views 208 and a number of entities 210 associated with views 208. For example, target drawing 202 could include one or more drawing sheets. Each drawing sheet could include top, front, side, isometric, section, detail, cutout, auxiliary, exploded, and/or other views 208 of a 3D component. Each view could include points, lines, arcs, circles, rays, splines, ellipses, and/or other geometric entities 210 that depict a 3D component within the view. In another example, target drawing 202 could include a floor plan, sketch, and/or another depiction of a 2D or 3D component or structure.

Graph generation engine 122 creates a graph 204 representing target drawing 202. First, graph generation engine 122 adds a number of nodes 214(1)-(3) representing entities 210 in target drawing 202 to graph 204. Next, graph generation engine 122 adds a number of edges 216(1)-(4) connecting pairs of nodes 214 within graph 204. Each edge in graph 204 represents a spatial and/or semantic relationship between entities 210 represented by the corresponding pair of nodes 214. Graph generation engine 122 further associates nodes 214 and edges 216 in graph 204 with attributes of the corresponding entities and relationships within target drawing 202 and/or a model associated with target drawing 202.

For example, graph generation engine 122 could convert a drawing file that represents target drawing 202 and is in a binary, structured, or another format into a standardized format. The standardized format could include key-value pairs associated with views 208, entities 210, and/or other components of target drawing 202. Next, graph generation engine 122 could convert iterate over views 208 within the standardized format. For each view, graph generation engine 122 could convert representations of entities 210 within the view into a set of nodes 214 in graph 204. Each node could include attributes such as a unique identifier, a type of entity represented by the node (e.g., point, line, circle, ellipse, arc, ray, spline, material, manufacturing method, dimension, etc.), and/or one or more attributes related to the geometric entity (e.g., a center, end point, length, normal, start point, radius, angle, and/or another value describing the geometric entity in the view). When two entities 210 touch, overlap, cross, are connected, are contained within one another, are parallel, are perpendicular, are grouped under the same entity (e.g., an assembly, a view, etc.), have a parent-child relationship or dependency (e.g., one entity is a dimension for another entity, one entity is a material for another entity, one entity is a manufacturing method for another entity, etc.), or share another type of spatial or semantic relationship within the view, graph generation engine 122 could connect the corresponding nodes with an edge. The edge could include attributes such a unique identifier, two node identifiers for the nodes connected by the edge, the type of relationship represented by the edge, and/or one or more attributes related to the relationship (e.g., the amount of overlap between the two entities 210, the distance between the two entities 210, the points at which the two entities 210 touch or overlap, an angle between the two entities 210, etc.).

Continuing with the above example, after sets of nodes 214 and edges 216 are created for all views 208 in target drawing 202, graph generation engine 122 could merge the sets of nodes 214 and edges 216 into a single set of nodes and edges within an overall graph 204 for target drawing 202. Within the overall graph 204, each entity is represented by a single node, even if the entity is found in multiple views 208. Graph generation engine 122 could also maintain a separate view-specific version of graph 204 for each view in target drawing 202. Each view-specific version of graph 204 includes a subset of nodes 214 and edges 216 representing the entities and relationships in the corresponding view. Generation of graphs from multiple views in a drawing is described in further detail below with respect to FIGS. 3A-3B.

In some embodiments, graph generation engine 122 also includes functionality to convert drawings with existing dimensions into graphs. For example, graph generation engine 122 could be used to convert drawings that have been manually dimensioned by users into graphs. As with target drawing 202, graph generation engine 122 could convert each drawing from a binary, structured, and/or another format into a standardized format. The standardized format would include representations of dimensions in the drawing, in addition to representations of views, entities, and/or other components in the drawing. Graph generation engine 122 could use the standardized format to generate a graph with nodes and edges that represent the entities and relationships within the corresponding drawing. Graph generation engine 122 could also use the standardized format to add dimensions to the graph and associate the dimensions with nodes and/or edges representing the corresponding entities and/or relationships. Within the graph, each dimension could include a unique identifier, the value of the dimension, a unit associated with the dimension (e.g., inches, feet, meters, degrees, radians, etc.), the type of dimension (e.g., linear, angular, radial, ordinate, etc.), one or more attributes that describe the appearance of the dimension within the drawing (e.g., start point, end point, rotation, normal, etc.), and/or one or more attributes that describe the appearance of the dimension within the model (e.g., a start and end point of the dimension within the 3D space occupied by the model).

Graph analysis engine 124 uses an embedding model 206 to generate target node embeddings 232 representing nodes 214 in graph 204. In some embodiments, embedding model 206 includes a graph neural network with an encoder and a core component. The encoder converts each node in a given graph into a node embedding that is a fixed-length vector representation of the node's attributes and/or associated edges in a lower-dimensional space. The core component performs a message passing procedure that iteratively updates each node embedding based on target node embeddings 232 for an increasing "radius" other nodes relative to the node until a certain number of updates is performed. The structure of embedding model 206 is described in further detail below with respect to FIG. 4.

Graph analysis engine 124 also uses embedding model 206 and/or target node embeddings 232 to generate a target graph embedding 234 representing graph 204 and one or more target view embeddings 236 representing views 208. In one or more embodiments, graph analysis engine 124 uses mean pooling, max pooling, and/or another aggregation operation to combine target node embeddings 232 for multiple nodes 214 in graph 204 into a single target graph embedding 234 representing graph 204. Graph analysis engine 124 may also use the same aggregation operation or a different aggregation operation to combine target node embeddings 232 for nodes 214 in a view-specific version of graph 204 into a target view embedding representing the corresponding view.

Those skilled in the art will appreciate that graph analysis engine 124 may be configured to generate target node embeddings 232, target graph embedding 234, and target view embeddings 236 in other ways. For example, separate embedding models could be used to produce target node embeddings 232, target graph embedding 234, and/or target view embeddings 236. In a second example, target node embeddings 232, target graph embedding 234, and/or target view embeddings 236 could be produced using convolutional kernels, attention mechanisms, and/or other types of deep learning or computer vision techniques. In a third example, graph analysis engine 124 could use a hierarchical graph embedding model 206 to generate target node embeddings 232, target graph embeddings 234, and target view embeddings 236. The hierarchical graph embedding model 206 could include a differentiable graph pooling module that generates a hierarchical representation of an input graph by clustering embeddings generated by a given layer and aggregating the embeddings in each cluster into a single embedding that used as input into the next layer. The first layer of the hierarchical graph embedding model 206 could be used to generate target node embeddings 232 for nodes in a given version of graph 204, and the last layer of the hierarchical graph embedding model 206 could be used to generate a single target graph embedding 234 representing the version of graph 204. Thus, the hierarchical graph embedding model 206 could be applied to the overall graph 204 representing target drawing 202 to produce target node embeddings 232 that represent nodes 214 within the overall graph 204 and target graph embedding 234. The hierarchical graph embedding model 206 could also be applied to each view-specific version of graph 204 to produce target node embeddings 232 that represent nodes 214 within the view-specific version and a target view embedding for the corresponding view.

After target node embeddings 232, target graph embedding 234, and target view embeddings 236 are produced, mapping engine 126 matches target graph embedding 234 to a number of source graph embeddings 240 representing source drawings 212 with existing dimensions. For example, mapping engine 126 could match target drawing 202 to a set of source drawings 212 from the same user, a set of source drawings 212 from users associated with a team or project, a set of source drawings 212 associated with a company or organization, a set of source drawings 212 associated with one or more tags or categories, a set of source drawings 212 with standardized components and dimensions, a set of source drawings 212 selected by the user creating target drawing 202, a set of source drawings 212 available on a computer aided design (CAD) program, a manually curated set of source drawings 212, and/or a set of source drawings 212 associated with another attribute. Mapping engine 126 could retrieve precomputed source graph embeddings 240 for source graphs representing source drawings 212 from a repository (e.g., after source graph embeddings are generated by graph analysis engine 124 and/or embedding model 206). Mapping engine 126 could also, or instead, receive one or more source graph embeddings 240 from graph analysis engine 124 (e.g., if the source graph embedding(s) have not been precomputed or are not in the repository).

Next, mapping engine 126 determines graph similarities 242 between target graph embedding 234 and source graph embeddings 240 and uses graph similarities 242 to identify one or more source drawings 212 as source dimension candidates 244 from which source dimensions 218 can be retrieved and added to target drawing 202. For example, mapping engine 126 could calculate graph similarities 242 as a cosine similarity, Euclidean distance, dot product, and/or another measure of vector similarity or distance between target graph embedding 234 and each source graph embedding. Mapping engine 126 could then rank source drawings 212 by descending graph similarity and use the ranked source drawings 212 to select, as source dimension candidates 244, one or more source drawings 212 with the highest graph similarities 242 and/or one or more source drawings with graph similarities 242 that exceed a numeric or percentile threshold.

Mapping engine 126 then retrieves source node embeddings 246 for nodes in one or more source graphs representing source dimension candidates 244 and calculates node similarities 248 between target node embeddings 232 for nodes 214 in graph 204 and source node embeddings 246. For example, mapping engine 126 could retrieve precomputed source node embeddings 246 from a repository and/or receive one or more sets of source node embeddings 246 for the source graphs from graph analysis engine 124. Mapping engine 126 could calculate node similarities 248 as a cosine similarity, Euclidean distance, and/or another measure of vector similarity or distance between each of target node embeddings 232 and each of source node embeddings 246. Thus, for m target node embeddings 232 and n source node embeddings 246, mapping engine 126 would generate m×n node similarities 248.

Mapping engine 126 uses node similarities 248 to generate node mappings 250 between nodes 214 in graph 204 and a corresponding set of nodes associated with a source drawing included in source dimension candidates 244. As described in further detail below with respect to FIG. 5, mapping engine 126 may use a bipartite alignment technique to generate node mappings 250 so that an "overall" similarity that is calculated by aggregating node similarities 248 between nodes 214 and the corresponding set of nodes mapped to nodes 214 is maximized. Mapping engine 126 may also, or instead, use one or more other techniques to generate node mappings 250. These techniques include (but are not limited to) maximal matching, network flow, and/or sub-graph matching.

Finally, mapping engine 126 uses node mappings 250 and source dimensions 218 from the selected source drawing to generate dimension placements 220 within target drawing 202. For example, mapping engine 126 could use node mappings 250 to identify, for a given entity in target drawing 202, a source entity in the source drawing to which the entity is mapped. Mapping engine 126 could retrieve a source dimension for the source entity from the source drawing and place the source dimension as a target dimension for the entity in target drawing 202. During placement of the target dimension in target drawing 202, mapping engine 126 could copy the spacing, orientation, and/or other formatting related to the source dimension into the target dimension. To improve the quality and accuracy of dimension placements 220, mapping engine 126 could also restrict dimension placements 220 to source dimensions 218 associated with node similarities 248 that exceed a threshold. In another example, mapping engine 126 could use node mappings 250 to identify, for a given target dimension in target drawing 202 that is represented by a node in graph 204, a corresponding source dimension in the source drawing to which the target dimension is mapped. Mapping engine 126 could then copy the value of the source dimension and formatting related to the source dimension into the target dimension.

When multiple source dimension candidates 244 exist, mapping engine 126 may generate multiple sets of node mappings 250 between nodes 214 and multiple sets of nodes from source graphs representing source dimension candidates 244. Mapping engine 126 may aggregate node similarities 248 associated with each set of node mappings 250 into an overall similarity between target drawing 202 and the corresponding source drawing to which entities 210 in target drawing 202 are mapped. Mapping engine 126 may then identify the source drawing with the overall similarity with the target drawing and use source dimensions 218 from the identified source drawing and node mappings 250 between the source drawing and target drawing 202 to perform dimension placements. Alternatively, mapping engine 126 may combine the overall similarity between each source dimension candidate and target drawing 202 with graph similarities 242 between the source dimension candidate and target drawing 202 into a similarity score between the source dimension candidate and target drawing 202. Mapping engine 126 may also identify, within source dimension candidates 244, a source drawing with the highest similarity score. Mapping engine 126 may then use source dimensions 218 from the identified source drawing and node mappings 250 between the source drawing and target drawing 202 to perform dimension placements 220.

Mapping engine 126 may also, or instead, generate node mappings 250 and corresponding dimension placements 220 between target drawing 202 and multiple source drawings 212. For example, mapping engine 126 could identify source dimension candidates 244 as a fixed number of source drawings with the highest graph similarities 242 and/or a variable number of source drawings with graph similarities 242 that exceed a threshold. Mapping engine 126 could calculate node similarities 248 between each of target node embeddings 232 and each of source node embeddings 246 for nodes in source graphs for source dimension candidates 244. Mapping engine 126 could then generate node mappings 250 between each node included in nodes 214 and a corresponding node with the highest node similarity from the source graphs. Finally, mapping engine 126 could use node mappings 250 to perform dimension placements 220 of source dimensions 216 as target dimensions for the corresponding entities in target drawing 202

In one or more embodiments, mapping engine 126 generates dimension placements 220 based on node similarities 248 and/or node mappings 250 between views 208 in target drawing 202 and corresponding views in a source drawing, in lieu of or in addition to performing dimension placements 220 based on node similarities 248 and/or node mappings 250 between target drawing 202 and the source drawing. For example, mapping engine 126 could calculate "view similarities" between target view embeddings 236 and a set of source view embeddings for a set of views in a source drawing. Mapping engine 126 could generate "view mappings" between views 208 and dimensioned views in the source drawing in a way that maximizes an aggregation of view similarities between views 208 and the dimensioned views. Mapping engine 126 could use the view mappings to generate node similarities 248, node mappings 250, and dimension placements 220 between a subset of nodes 214 in each view within target drawing 202 and a corresponding view in the source drawing to which the view is mapped. If mapping engine 126 has also performed dimension placements 220 based on node similarities 248 and/or node mappings 250 between target drawing 202 and the source drawing, mapping engine 126 could allow a user to select a target dimension for an entity in target drawing 202 from multiple source dimensions 218 associated with node mappings 250 with the entity. Mapping engine 126 could also, or instead, select a target dimension for the entity as the source dimension for a source entity that has the highest node similarity with the entity.

Figure 3A:
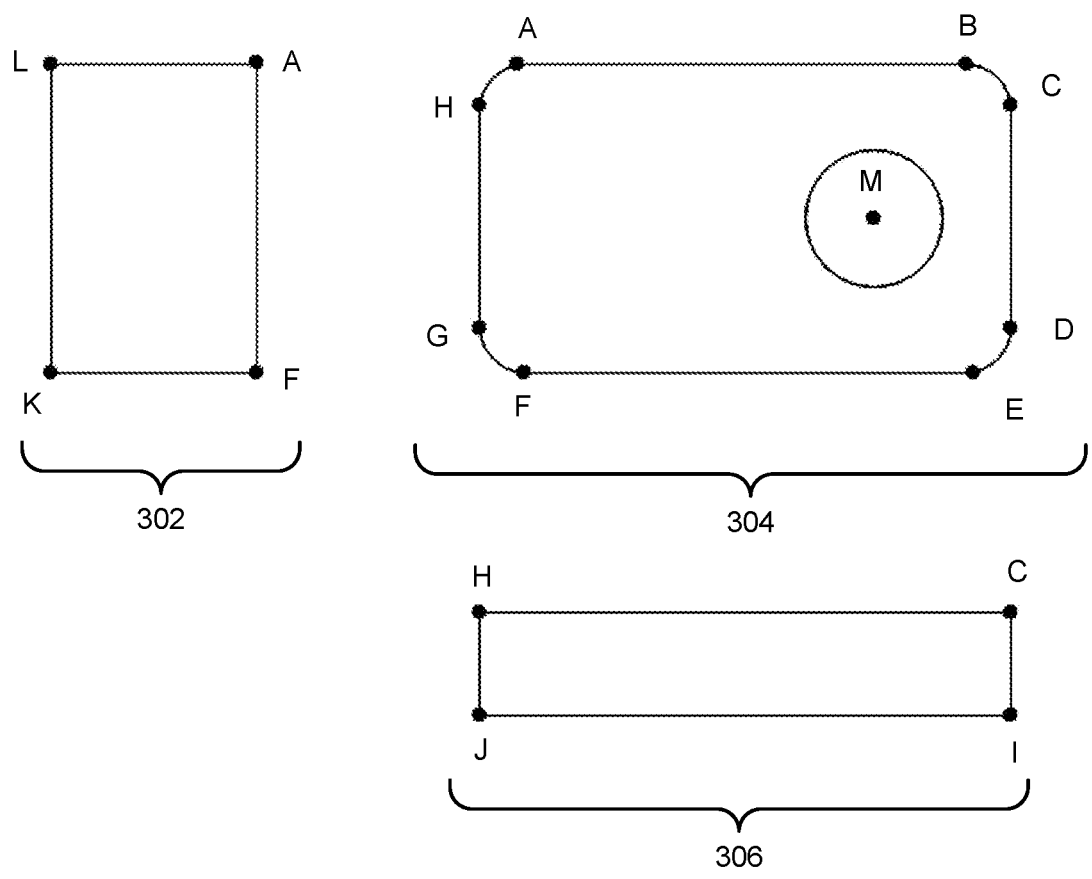
FIG. 3A illustrates an exemplar drawing of a component, according to various embodiments.

FIG. 3A illustrates an exemplar drawing of a component, according to various embodiments. As shown in FIG. 3A, the drawing includes multiple views 302-306 of the component. For example, views 302-306 could include a top, front, and side view of the component.

Each view includes a number of entities that are connected via spatial relationships. View 302 includes entities A, F, K, and L. Within view 302, entities A and F, A and L, L and K, and F and K are connected by lines.

View 304 includes entities A, B, C, D, E, F, G, H, and M. Within view 304, entities A and B, C and D, E and F, and G and H are connected by lines. Entities B and C, D and E, F and G, and A and H are connected by arcs. Entity M includes a circle that is not connected to any other entity.

View 306 includes entities C, H, I, and J. Within view 306, entities C and H, C and I, I and J, and J and H are connected by lines.

Figure 3B:
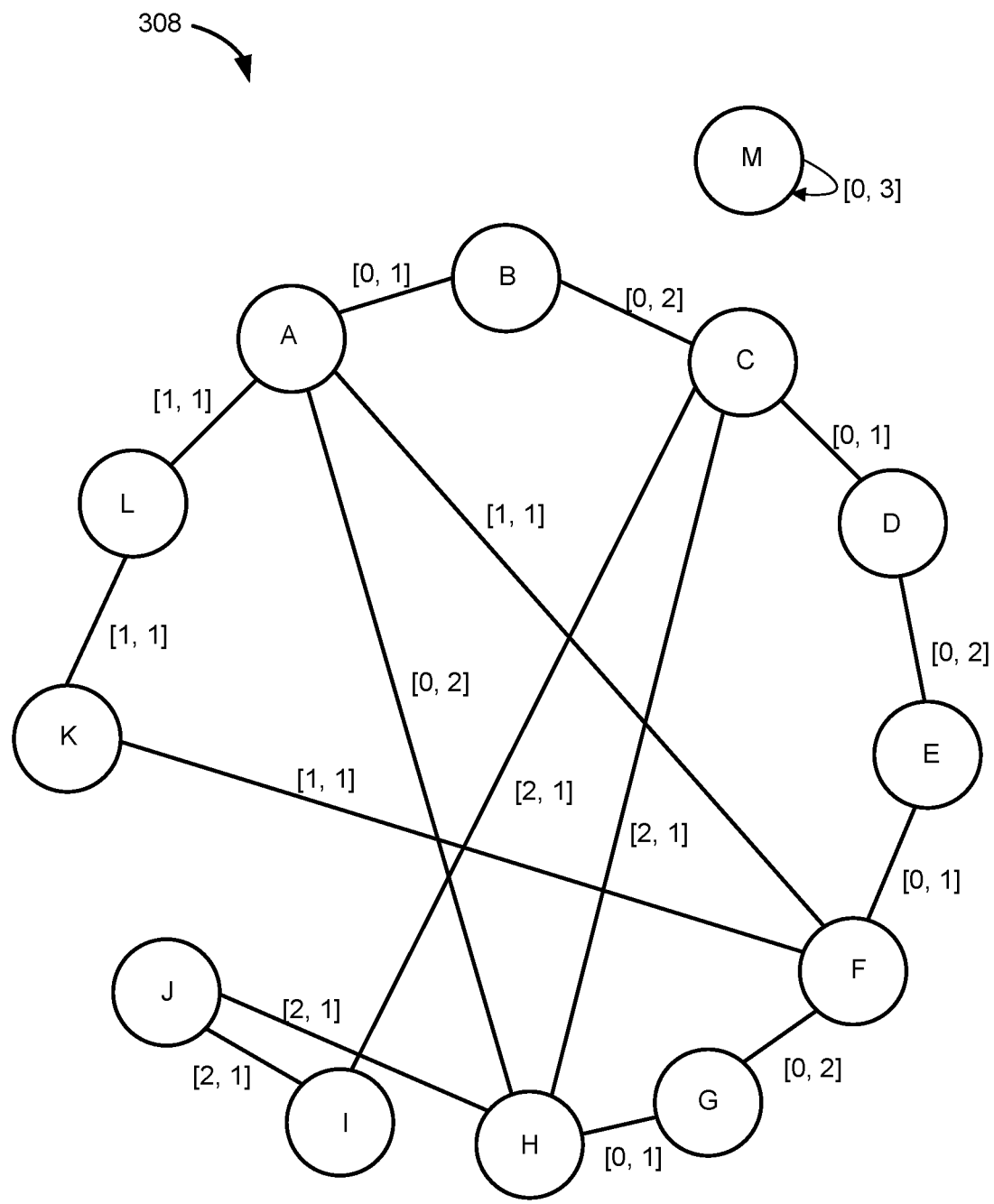
FIG. 3B illustrates an exemplar graph created from the drawing of FIG. 3A, according to various embodiments.

FIG. 3B illustrates an exemplar graph 308 created from the drawing of FIG. 3A, according to various embodiments. Graph 308 includes nodes representing entities A, B, C, D, E, F, G, H, I, J, K, L, and M in the drawing. Graph 308 also includes edges between nodes that represent spatial relationships between the corresponding entities in the drawing.

Within graph 308, nodes representing entities A and F, A and L, L and K, and F and K are connected by edges to represent lines between the corresponding entities in view 302. Nodes representing entities A and B, C and D, E and F, and G and H are connected by edges to represent lines between the corresponding entities in view 304. Nodes representing entities B and C, D and E, F and G, and A and H are connected by edges to represent arcs between the corresponding entities in view. The node representing entity M includes an edge that connects to itself to indicate that entity M has a spatial relationship with itself. Nodes representing entities C and H, C and I, I and J, and J and H are connected by edges to represent lines between the corresponding entities in view 306.

Each edge in graph 308 is also associated with a pair of numeric values. The first numeric value indicates the view in which the relationship is found, with a value of 0 representing view 302, a value of 1 representing view 304, and a value of 2 representing view 306. The second numeric value indicates the type of relationship represented by the edge, with a value of 1 indicating a line, a value of 2 indicating an arc, and a value of 3 indicating a circle.

As a result, graph 308 includes a "merged" representation of entities and relationships in all three views 302-306. Each entity is represented by a single node in graph 308, even if the entity appears in multiple views within the drawing. Graph 308 additionally includes edges representing spatial relationships between entities across all views 302-306.

Figure 4:
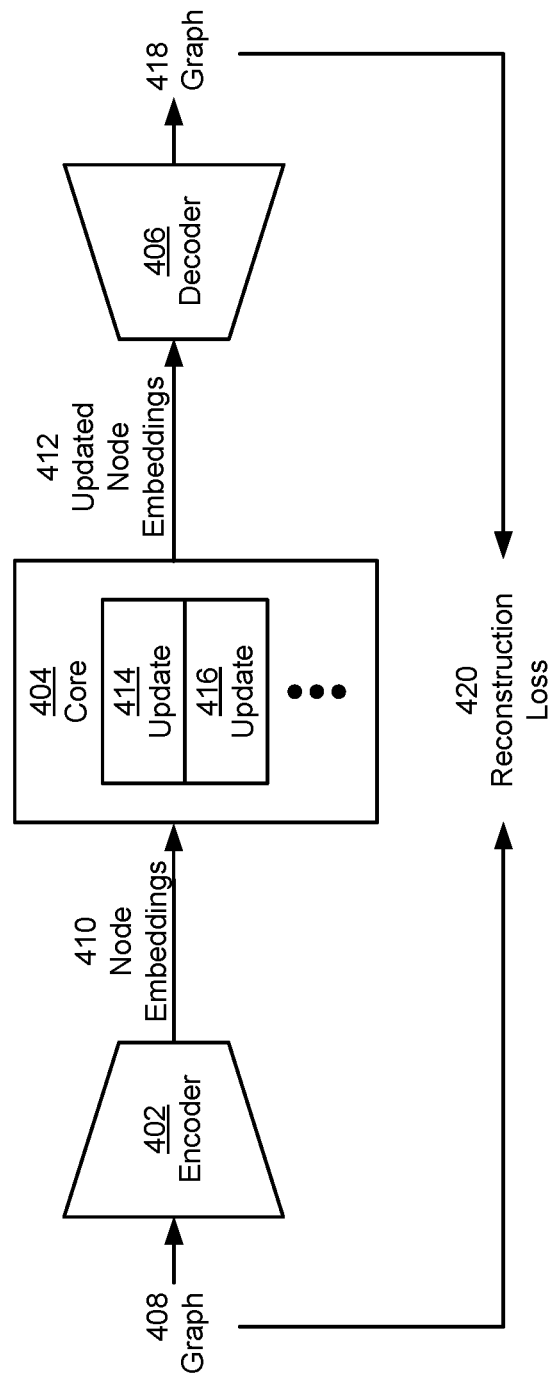
FIG. 4 is a more detailed illustration of the embedding model of FIG. 2, according to various embodiments.

FIG. 4 is a more detailed illustration of the embedding model of FIG. 2, according to various embodiments. As shown in FIG. 4, the embedding model includes an encoder 402, a core 404, and a decoder 406. Encoder 402 converts an input graph 408 into a set of node embeddings 410 representing nodes in the input graph 408. For example, encoder 402 could convert a set of features associated with each node in graph 408 (e.g., entity attributes from a drawing, representations of edges between the node and other nodes in graph 408, etc.) into a corresponding node embedding.

Core 404 performs multiple rounds of iterative updates 414-416 to node embeddings 410 to produce a set of updated node embeddings 412. Each update incorporates information from within a certain hop count of a given node into the node embedding for the node. For example, the first update 414 performed by core 404 could include pooling of node embeddings 410 for neighbors of the node in graph 408 and concatenation of the node's embedding with the pooled node embeddings 410 for the neighbors. The second update 416 performed by core 404 could include pooling of node embeddings 410 for second-degree neighbors of the node in graph 408 and concatenation of the pooled node embeddings 410 for the second-degree neighbors with the first update 414. Each additional update would thus include additional pooling of node embeddings 410 for nodes that are the next hop count from the node in graph 408, followed by concatenation of the pooled node embeddings with the previous update.

After core 404 has performed a certain number of updates to node embeddings 410, updated node embeddings 412 from core 404 are inputted into decoder 406, and decoder 406 converts updated node embeddings 412 into an output graph 418. For example, decoder 406 could convert fixed-length vectors outputted by core 404 into a set of features associated with the corresponding nodes.

Encoder 402, core 404, and decoder 406 are additionally trained using a reconstruction loss 420 between graphs 408 and 418. For example, a transform layer could be applied to the output of decoder 406 to generate feature representations of the set of nodes that can be compared with feature representations inputted into encoder 402. Next, reconstruction loss 420 could be calculated to reflect the differences between the feature representations inputted into encoder 402 and the feature representations outputted by decoder 406 and/or the transform layer. Reconstruction loss 420 between multiple input and output graphs could then be propagated backward across layers of the transform layer, decoder 406, core 404, and encoder 402 until reconstruction loss 420 falls below a threshold.

After the embedding model is trained, encoder 402 and core 404 are used to generate updated node embeddings 412 for new input graphs. For example, encoder 402 and core 404 could be used to convert features associated with nodes 214 in graph 204 into updated node embeddings 412 representing target node embeddings 232 for entities 210 in target drawing 202. Encoder 402 and core 404 could also be used to convert features associated with nodes in source graphs representing source drawings into updated node embeddings 412 representing source node embeddings 246 for the entities in the source drawings. Node embeddings for entities in a given drawing (or view) could additionally be aggregated into a graph embedding representing the drawing (or a view embedding representing the view), as discussed above.

Those skilled in the art will appreciate that the embedding model can be structured, trained, and/or executed in various ways. For example, decoder 406 could be omitted from the embedding model, and encoder 402 and/or core 404 could be trained in a task-driven manner to predict graph properties, node attributes or types, similarities between nodes and/or graphs, and/or other types of attributes. In another example, the embedding model could be trained using unsupervised, self-supervised, and/or semi-supervised approaches, such as (but not limited to) Barlow Twins, SimCLR, Bootstrap Your Own Latent (BYOL), Pretext-Invariant Representation Learning (PIRL), Swapping Assignments between Views (SwAV), and/or Momentum Contrast (MoCo). In a third example, node embeddings 410 and/or updated node embeddings 412 could be generated for a subset of nodes sampled from a graph of a geometrically complex entity (e.g., a spline), and a graph embedding for the entity could be generated from an aggregation of these node embeddings 410 and/or updated node embeddings 412.

Figure 5:
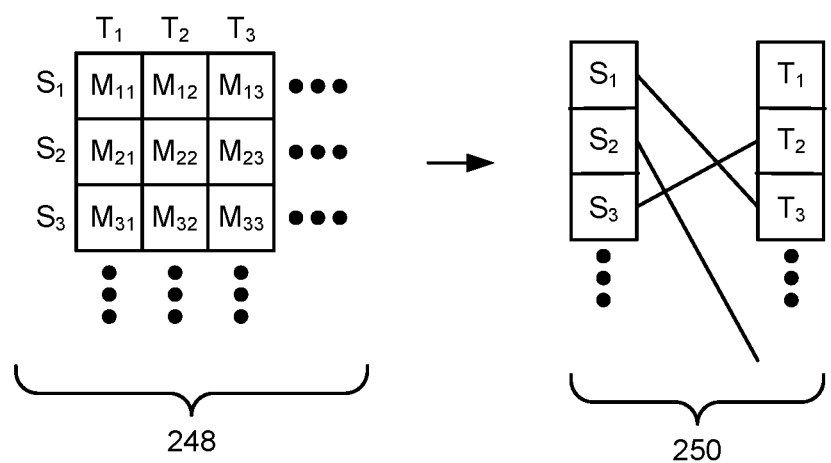
FIG. 5 illustrates how node similarities and node mappings between a set of source nodes in a source graph and a set of target nodes in a target graph are generated, according to various embodiments.

FIG. 5 illustrates how node similarities 248 and node mappings 250 between a set of source nodes $S_1$, $S_2$, $S_3$, . . . in a source graph and a set of target nodes $T_1$, $T_2$, $T_3$, . . . in a target graph are generated, according to various embodiments. As shown in FIG. 5, node similarities 248 include pairwise node similarities 248 $M_{11}$, $M_{12}$, $M_{13}$, $M_{21}$, $M_{22}$, $M_{23}$, $M_{31}$, $M_{32}$, $M_{33}$, . . . calculated between each source node and each target node. For example, each node similarity $M_{XY}$ could include a measure of vector similarity between a first embedding representing a source node X and a second embedding representing a target node Y. Each node similarity could also, or instead, include a measure of local topological similarity between the source node and target node.

After node similarities 248 are calculated, node mappings 250 are generated between the source nodes and target nodes based on node similarities 248. For example, a Hungarian technique could be used to assign a source node to each target node so that the sum of node similarities 248 associated with the assigned pairs of source nodes and target nodes is maximized.

Figure 6:
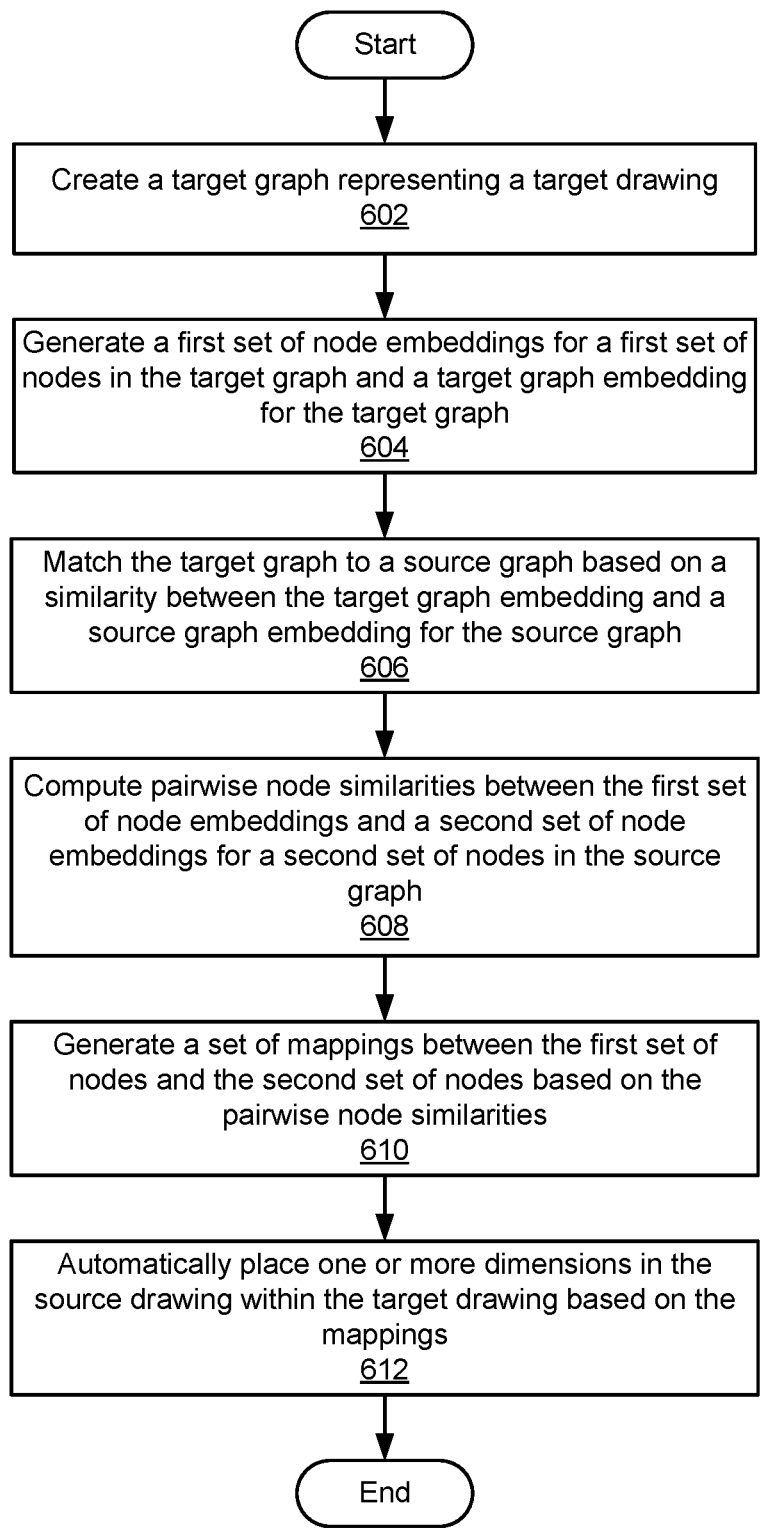
FIG. 6 sets forth a flow diagram of method steps for automatically dimensioning a target drawing, according to various embodiments.

FIG. 6 sets forth a flow diagram of method steps for automatically dimensioning a target drawing, according to various embodiments. Although the method steps are described in conjunction with the systems of FIGS. 1-4, persons skilled in the art will understand that any system configured to perform the method steps in any order falls within the scope of the present disclosure.

As shown, graph generation engine 122 creates 602 a target graph representing a target drawing. For example, graph generation engine 122 could create, within the target graph, a first set of nodes representing a set of entities (e.g., points, lines, arcs, circles, ellipses, dimensions, materials, manufacturing methods, assemblies, etc.) in the target drawing. Graph generation engine 122 could also add edges connecting pairs of nodes in the target graph. Each edge represents a spatial and/or semantic relationship between a corresponding pair of entities included in the target drawing. Graph generation engine 122 could further associate the nodes and edges with attributes of the corresponding entities and relationships.

Next, graph analysis engine 124 generates 604 a first set of node embeddings for the first set of nodes in the target graph and a target graph embedding for the target graph. For example, graph analysis engine 124 could apply an encoder in an embedding model to features (e.g., attributes, edges, etc.) for each node in the target graph to produce a node embedding for the node. Graph analysis engine 124 could also use a core component in the embedding model to iteratively update the node embedding based on node embeddings of nodes that are a certain hop count from the node in the graph. Graph analysis engine 124 could then aggregate the updated node embeddings for the first set of nodes into a target graph embedding for the target graph.

Mapping engine 126 matches 606 the target graph to a source graph based on a similarity between the target graph embedding and a source graph embedding for the source graph. For example, mapping engine 126 could compute a set of vector similarities between the target graph embedding and a set of source graph embeddings for source drawings with placed dimensions. Graph analysis engine 124 could then match the target graph to the source graph associated with the highest vector similarity within the set of vector similarities.

Mapping engine 126 also computes 608 pairwise node similarities between the first set of node embeddings and a second set of node embeddings for a second set of nodes in the source graph. For example, mapping engine 126 could receive the second set of node embeddings from graph analysis engine 124, a repository, and/or another source. Mapping engine 126 could then calculate the pairwise node similarities as measures of vector similarity between each node embedding included in the first set of node embeddings and each node embedding included in the second set of node embeddings.

Mapping engine 126 then generates 610 a set of mappings between the first set of nodes and the second set of nodes based on the pairwise node similarities. For example, mapping engine 126 could use a bipartite alignment technique to generate the mappings in a way that maximizes the sum of pairwise node similarities associated with the mapped nodes.

Finally, mapping engine 126 automatically places 612 one or more dimensions in the source drawing within the target drawing based on the mappings. For example, mapping engine 126 could retrieve a source dimension for each source entity in the source drawing that is associated with a mapping generated in operation 610. Mapping engine 126 could optionally verify that the pairwise node similarity associated with the mapping exceeds a threshold. Mapping engine 126 could then copy the source dimension and associated appearance (e.g., orientation, formatting, style, spacing, etc.) from the source entity in the source drawing to a target entity in the target drawing to which the source entity is mapped.

In sum, the disclosed techniques perform automatic dimensioning of drawings using machine learning and graph alignment. A target drawing is converted into a graph, with a first set of nodes in the graph representing entities in the target drawing and edges between pairs of nodes representing spatial and/or semantic relationships between the corresponding entities. One or more embedding models are used to generate a first set of node embeddings for the first set of nodes, a target graph embedding for the target drawing, and/or one or more view embeddings representing one or more views within the target drawing. Graph similarities are calculated between the target graph embedding and a set of source graph embeddings for a set of source drawings with placed dimensions, and a source drawing associated with the highest graph similarity (or another measure of similarity with the target drawing) is identified. Pairwise node similarities are then calculated between the first set of node embeddings and a second set of node embeddings for a second set of nodes in a source graph representing the source drawing, and mappings between the first set of nodes and second set of nodes are generated to maximize an aggregation of the corresponding node similarities. Dimensions for source entities in the source drawing are then added to entities in the target drawing to which the source entities are mapped.

One technical advantage of the disclosed techniques relative to the prior art is that, with the disclosed techniques, the amount of time and user effort required to dimension drawings within a CAD program can be substantially reduced. In that regard, the disclosed techniques can be used to perform dimensioning of drawings within a CAD program in a more computationally efficient manner relative to prior art approaches. Another technical advantage is that, with the disclosed techniques, user-specified or standardized attributes of dimensions from one or more source drawings can be transferred to a target drawing. Accordingly, dimensions placed into a target drawing automatically via the disclosed techniques are able to conform to various design documentation requirements more readily relative to dimensions placed automatically via conventional rules-based auto-dimensioning tools. These technical advantages provide one or more technological improvements over prior art approaches.

1. In some embodiments, a computer-implemented method for automatically adding dimensions to a target drawing comprises generating a first set of node embeddings for a first set of nodes included in a target graph that represents the target drawing, receiving a second set of node embeddings for a second set of nodes included in a source graph that represents a source drawing, wherein one or more nodes included in the second set of nodes are associated with one or more source dimensions included in the source drawing, generating a set of mappings between the first set of nodes and the second set of nodes based on one or more similarities between the first set of node embeddings and the second set of node embeddings, and automatically placing at least one dimension included in the one or more source dimensions within the target drawing based on the set of mappings.

2. The computer-implemented method of clause 1, further comprising generating the first set of nodes within the target graph based on a set of entities included in the target drawing, and generating a first set of edges within the target graph, wherein each edge included in the first set of edges connects a pair of nodes included in the first set of nodes and represents a spatial relation between a pair of entities included in the target drawing that correspond to the pair of nodes.

3. The computer-implemented method of clauses 1 or 2, further comprising performing one or more operations on the target graph via an embedding model to generate a target graph embedding, and matching the target graph to the source graph based on a similarity between the target graph embedding and a source graph embedding associated with the source drawing.

4. The computer-implemented method of any of clauses 1-3, wherein matching the target graph to the source graph comprises retrieving a plurality of source graph embeddings for a plurality of source graphs, wherein each source graph shares one or more attributes with the target graph, computing a plurality of graph embedding similarities between the target graph embedding and the plurality of source graph embeddings, and matching the target graph to the source graph associated with a greatest graph embedding similarity included in the plurality of graph embedding similarities.

5. The computer-implemented method of any of clauses 1-4, wherein performing the one or more operations on the target graph comprises applying the embedding model to the first set of nodes to generate the first set of node embeddings, and generating the target graph embedding based on the first set of node embeddings.

6. The computer-implemented method of any of clauses 1-5, wherein the first set of node embeddings is generated by applying an encoder to the target graph.

7. The computer-implemented method of any of clauses 1-6, wherein generating the first set of node embeddings comprises iteratively updating a node embedding for a first node based on one or more node embeddings for one or more nodes that reside within a hop count from the first node in the target graph.

8. The computer-implemented method of any of clauses 1-7, wherein generating the set of mappings between the first set of nodes and the second set of nodes comprises computing a set of pairwise node similarities between the first set of node embeddings and the second set of node embeddings, and generating the set of mappings based on one or more pairwise node similarities included in the set of pairwise node similarities that maximize an overall similarity between the first set of node embeddings and the second set of node embeddings.

9. The computer-implemented method of any of clauses 1-8, wherein the one or more source dimensions comprise at least one of a linear dimension, an angular dimension, an ordinate dimension, or a radial dimension.

10. The computer-implemented method of any of clauses 1-9, wherein the first set of nodes represents at least one of a point, a line, an arc, a circle, or an ellipse.

11. In some embodiments, one or more non-transitory computer readable media storing instructions that, when executed by one or more processors, cause the one or more processors to perform the steps of generating a first set of node embeddings for a first set of nodes included in a target graph that represents a target drawing, receiving a second set of node embeddings for a second set of nodes included in a source graph that represents a source drawing, wherein one or more nodes included in the second set of nodes are associated with one or more source dimensions included in the source drawing, generating a set of mappings between the first set of nodes and the second set of nodes based on one or more similarities between the first set of node embeddings and the second set of node embeddings, and automatically placing at least one dimension included in the one or more source dimensions within the target drawing based on the set of mappings.

12. The one or more non-transitory computer readable media of clause 11, wherein the instructions further cause the one or more processors to perform the steps of generating the first set of nodes within the target graph based on a set of entities included in the target drawing, and generating a first set of edges within the target graph, wherein each edge included in the first set of edges connects a pair of nodes included in the first set of nodes and represents a spatial relation between a pair of entities included in the target drawing that correspond to the pair of nodes.

13. The one or more non-transitory computer readable media of clauses 11 or 12, wherein adding the first set of nodes to the target graph comprises generating a second set of nodes representing a second set of entities in a first view of the target drawing, generating a third set of nodes representing a third set of entities in a second view of the target drawing, and merging the second set of nodes and the third set of nodes into the first set of nodes, wherein each node included in the first set of nodes corresponds to an entity included in one or more views of the target drawing.

14. The one or more non-transitory computer readable media of any of clauses 11-13, wherein the instructions further cause the one or more processors to perform the step of matching the target graph to the source graph based on a similarity between a target graph embedding associated with the target graph and a source graph embedding associated with the source drawing.

15. The one or more non-transitory computer readable media of any of clauses 11-14, wherein the instructions further cause the one or more processors to perform the step of generating the target graph embedding for the target graph based on an aggregation of the first set of node embeddings.

16. The one or more non-transitory computer readable media of any of clauses 11-15, wherein matching the target graph to the source graph comprises applying a threshold to the similarity between the target graph embedding and the source graph embedding.

17. The one or more non-transitory computer readable media of any of clauses 11-16, wherein generating the set of mappings between the first set of nodes and the second set of nodes comprises matching a first view of the target drawing to a second view of the source drawing based on a similarity between a first view embedding for the first view and a second view embedding for the second view, and generating the set of mappings between the first set of nodes included in the first view and the second set of nodes included in the second view.

18. The one or more non-transitory computer readable media of any of clauses 11-17, wherein automatically placing the at least one dimension within the target drawing comprises associating a first entity in the target drawing with a dimension included in the one or more dimensions based on a mapping between a first node representing the first entity and a second node representing a second entity associated with the dimension in the source drawing.

19. The one or more non-transitory computer readable media of any of clauses 11-18, wherein automatically placing the at least one dimension within the target drawing further comprises verifying that a similarity between a first node embedding for the first node and a second node embedding for the second node exceeds a threshold prior to associating the first entity with the dimension.

20. In some embodiments, a system comprises a memory that stores instructions, and a processor that is coupled to the memory and, when executing the instructions, is configured to generate a first set of node embeddings for a first set of nodes included in a target graph that represents a target drawing, receive a second set of node embeddings for a second set of nodes included in a source graph that represents a source drawing, wherein one or more nodes included in the second set of nodes are associated with one or more source dimensions included in the source drawing, generate a set of mappings between the first set of nodes and the second set of nodes based on one or more similarities between the first set of node embeddings and the second set of node embeddings, and automatically place at least one dimension included in the one or more source dimensions within the target drawing based on the set of mappings.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module," a "system," or a "computer." In addition, any hardware and/or software technique, process, function, component, engine, module, or system described in the present disclosure may be implemented as a circuit or set of circuits. Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A computer-implemented method for automatically adding dimensions to a target drawing, the method comprising:
generating a first set of node embeddings for a first set of nodes included in a target graph that represents the target drawing;
receiving a second set of node embeddings for a second set of nodes included in a source graph that represents a source drawing, wherein one or more nodes included in the second set of nodes are associated with one or more source dimensions for manufacturing one or more components represented by the one or more nodes, and the one or more source dimensions are included in the source drawing;
generating a set of mappings between the first set of nodes and the second set of nodes based on one or more similarities between the first set of node embeddings and the second set of node embeddings; and
automatically placing at least one dimension for manufacturing at least one component and is included in the one or more source dimensions within the target drawing based on the set of mappings.

2. The computer-implemented method of claim 1, further comprising:
generating the first set of nodes within the target graph based on a set of entities included in the target drawing; and
generating a first set of edges within the target graph, wherein each edge included in the first set of edges connects a pair of nodes included in the first set of nodes and represents a spatial relation between a pair of entities included in the target drawing that correspond to the pair of nodes.

3. The computer-implemented method of claim 1, further comprising:
performing one or more operations on the target graph via an embedding model to generate a target graph embedding; and
matching the target graph to the source graph based on a similarity between the target graph embedding and a source graph embedding associated with the source drawing.

4. The computer-implemented method of claim 3, wherein matching the target graph to the source graph comprises:
retrieving a plurality of source graph embeddings for a plurality of source graphs, wherein each source graph shares one or more attributes with the target graph;
computing a plurality of graph embedding similarities between the target graph embedding and the plurality of source graph embeddings; and
matching the target graph to the source graph associated with a greatest graph embedding similarity included in the plurality of graph embedding similarities.

5. The computer-implemented method of claim 3, wherein performing the one or more operations on the target graph comprises:
applying the embedding model to the first set of nodes to generate the first set of node embeddings; and
generating the target graph embedding based on the first set of node embeddings.

6. The computer-implemented method of claim 1, wherein the first set of node embeddings is generated by applying an encoder to the target graph.

7. The computer-implemented method of claim 1, wherein generating the first set of node embeddings comprises iteratively updating a node embedding for a first node based on one or more node embeddings for one or more nodes that reside within a hop count from the first node in the target graph.

8. The computer-implemented method of claim 1, wherein generating the set of mappings between the first set of nodes and the second set of nodes comprises:
   computing a set of pairwise node similarities between the first set of node embeddings and the second set of node embeddings; and
   generating the set of mappings based on one or more pairwise node similarities included in the set of pairwise node similarities that maximize an overall similarity between the first set of node embeddings and the second set of node embeddings.

9. The computer-implemented method of claim 1, wherein the one or more source dimensions comprise at least one of a linear dimension, an angular dimension, an ordinate dimension, or a radial dimension.

10. The computer-implemented method of claim 1, wherein the first set of nodes represents at least one of a point, a line, an arc, a circle, or an ellipse.

11. One or more non-transitory computer readable media storing instructions that, when executed by one or more processors, cause the one or more processors to perform the steps of:
   generating a first set of node embeddings for a first set of nodes included in a target graph that represents a target drawing;
   receiving a second set of node embeddings for a second set of nodes included in a source graph that represents a source drawing, wherein one or more nodes included in the second set of nodes are associated with one or more source dimensions for manufacturing one or more components represented by the one or more nodes, and the one or more source dimensions are included in the source drawing;
   generating a set of mappings between the first set of nodes and the second set of nodes based on one or more similarities between the first set of node embeddings and the second set of node embeddings; and
   automatically placing at least one dimension for manufacturing at least one component and is included in the one or more source dimensions within the target drawing based on the set of mappings.

12. The one or more non-transitory computer readable media of claim 11, wherein the instructions further cause the one or more processors to perform the steps of:
   generating the first set of nodes within the target graph based on a set of entities included in the target drawing; and
   generating a first set of edges within the target graph, wherein each edge included in the first set of edges connects a pair of nodes included in the first set of nodes and represents a spatial relation between a pair of entities included in the target drawing that correspond to the pair of nodes.

13. The one or more non-transitory computer readable media of claim 12, wherein adding the first set of nodes to the target graph comprises:
   generating a second set of nodes representing a second set of entities in a first view of the target drawing;
   generating a third set of nodes representing a third set of entities in a second view of the target drawing; and
   merging the second set of nodes and the third set of nodes into the first set of nodes, wherein each node included in the first set of nodes corresponds to an entity included in one or more views of the target drawing.

14. The one or more non-transitory computer readable media of claim 11, wherein the instructions further cause the one or more processors to perform the step of matching the target graph to the source graph based on a similarity between a target graph embedding associated with the target graph and a source graph embedding associated with the source drawing.

15. The one or more non-transitory computer readable media of claim 14, wherein the instructions further cause the one or more processors to perform the step of generating the target graph embedding for the target graph based on an aggregation of the first set of node embeddings.

16. The one or more non-transitory computer readable media of claim 14, wherein matching the target graph to the source graph comprises applying a threshold to the similarity between the target graph embedding and the source graph embedding.

17. The one or more non-transitory computer readable media of claim 11, wherein generating the set of mappings between the first set of nodes and the second set of nodes comprises:
   matching a first view of the target drawing to a second view of the source drawing based on a similarity between a first view embedding for the first view and a second view embedding for the second view; and
   generating the set of mappings between the first set of nodes included in the first view and the second set of nodes included in the second view.

18. The one or more non-transitory computer readable media of claim 11, wherein automatically placing the at least one dimension within the target drawing comprises associating a first entity in the target drawing with a dimension included in the one or more dimensions based on a mapping between a first node representing the first entity and a second node representing a second entity associated with the dimension in the source drawing.

19. The one or more non-transitory computer readable media of claim 18, wherein automatically placing the at least one dimension within the target drawing further comprises verifying that a similarity between a first node embedding for the first node and a second node embedding for the second node exceeds a threshold prior to associating the first entity with the dimension.

20. A system, comprising:
   a memory that stores instructions, and
   a processor that is coupled to the memory and, when executing the instructions, is configured to:
      generate a first set of node embeddings for a first set of nodes included in a target graph that represents a target drawing;
      receive a second set of node embeddings for a second set of nodes included in a source graph that represents a source drawing, wherein one or more nodes included in the second set of nodes are associated with one or more source dimensions for manufacturing one or more components represented by the one or more nodes, and the one or more source dimensions are included in the source drawing;
      generate a set of mappings between the first set of nodes and the second set of nodes based on one or more similarities between the first set of node embeddings and the second set of node embeddings; and
      automatically place at least one dimension for manufacturing at least one component and is included in the one or more source dimensions within the target drawing based on the set of mappings.

* * * * *